(12) United States Patent
Sorin et al.

(10) Patent No.: US 8,630,519 B2
(45) Date of Patent: Jan. 14, 2014

(54) PHOTODETECTING FIBER

(75) Inventors: Fabien Sorin, Paris (FR); Guillaume Lestoquoy, Cambridge, MA (US); Sylvain Danto, Clemson, MA (US); Yoel Fink, Brookline, MA (US); John D. Joannopoulos, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 104 days.

(21) Appl. No.: 13/253,200

(22) Filed: Oct. 5, 2011

(65) Prior Publication Data

US 2012/0263409 A1 Oct. 18, 2012

Related U.S. Application Data

(60) Provisional application No. 61/410,017, filed on Nov. 4, 2010.

(51) Int. Cl.
*G02B 6/44* (2006.01)
*G02B 6/26* (2006.01)
*G02B 6/02* (2006.01)

(52) U.S. Cl.
USPC .............................. 385/101; 385/39; 385/127

(58) Field of Classification Search
USPC .......................................... 385/39, 101, 127
See application file for complete search history.

(56) References Cited

U.S. PATENT DOCUMENTS

| | | | | |
|---|---|---|---|---|
| 5,949,935 | A * | 9/1999 | Schaafsma et al. | 385/43 |
| 6,555,945 | B1 * | 4/2003 | Baughman et al. | 310/300 |
| 6,687,437 | B1 * | 2/2004 | Starnes et al. | 385/101 |
| 2007/0019917 | A1 * | 1/2007 | Bayindir et al. | 385/123 |

OTHER PUBLICATIONS

A. Rogers, "Distributed optical-fiber sensing", Meas. Sci. Technol. 10, R75 (1999).
M. K. Barnoski and S. M. Jensen, "Fiber waveguides: a novel technique for investigating attenuation characteristics", Applied Optics 15, 2112 (1976).
A. J. Rogers. "Polarization optical time domain reflectometry: a technique for the measurement of field distributions", Applied Optics, 20 1060 (1981).
A. H. Hartog, "A distributed temperature sensor based on liquid-core optical fibers", IEEE J. Light. Tech., 1(3) 498 (1983).
J. P. Dakin, D. J. Pratt, G. W. Bibby, J. N. Ross, "Distributed optical fiber raman temperature sensor using a semiconductor light source and detector", Elec. Lett., 21, 569 (1985).
T. Kurashima, T. Horiguchi, and M. Tateda, "Distributed-temperature sensing using stimulated Brillouin scattering in optical silica fibers" Opt. Lett. , 15, 1038 (1990).
C. I. Merzbachery, A. D. Kersey and E. B. Friebele, "Fiber optic sensors in concrete structures: a review", Smart Mater. Struct. 5, 196 (1996).

(Continued)

*Primary Examiner* — Ryan Lepisto
*Assistant Examiner* — Erin Chiem
(74) *Attorney, Agent, or Firm* — Sam Pasternack; MIT Technology Licensing Office

(57) ABSTRACT

Photodetecting fiber. The fiber detects and localizes an incident optical beam. A semiconducting core is in intimate contact with a material forming a resistive channel that breaks axial symmetry. The resistive channel has a resistivity between that of metals and the semiconducting core, enabling the imposition of non-uniform, convex electric potential distributions along the fiber axis allowing photo-current measurements along the fiber.

3 Claims, 5 Drawing Sheets

(56) References Cited

OTHER PUBLICATIONS

X. Bao, D. J. Webb, D. A. Jackson, "Combined distributed temperature and strain sensor based on Brillouin loss in an optical fiber", Opt. Lett. 16, 141 (1994).

P. J. A. Sazio, A. Amezcua-Correa, C. E. Finlayson, J. R. Hayes, T. J. Scheidemantel, N. F. Baril, B. R. Jackson, D. J. Won, F. Zhang, E. R. Margine, V. Gopalan, V. H. Crespi, J. V. Badding, "Microstructured Optical Fibers as High-Pressure Microfluidic Reactors", Science 311, 1583 (2006).

T. T. Larsen, A. Bjarklev, D. S. Hermann, and J. Broeng, "Optical devices based on liquid crystal photonic bandgap fibres," Opt. Exp. 11, 2589 (2003).

B. O'Connor, K. H. An, Y. Zhao, K. P. Pipe, M. Shtein, "Fiber Shaped Organic Light Emitting Device", Adv. Mat. 19, 3897 (2007).

B. O'Connor, K. P. Pipe, M. Shtein, "Fiber based organic photovoltaic devices", Appl. Phys. Lett. 92, 193306 (2008).

M. Fokine, L. E. Nilsson, A. Claesson, D. Berlemont, L. Kjellberg, L. Krummenacher, and W. Margulis, "Integrated fiber Mach—Zehnder interferometer for electro-optic switching" Opt. Lett. 27, 1643 (2002).

M. A. Schmidt, L. N. Prill Sempere, H. K. Tyagi, C. G. Poulton, and P. St. J. Russell, "Waveguiding and plasmon resonances in two-dimensional photonic lattices of gold and silver nanowires" Phys. Rev. B, 77, 033417 (2008).

H. K. Tyagi, M. A. Schmidt, L. Prill Sempere and P. St.J. Russell, "Optical properties of photonic crystal fiber with integral micron-sized Ge wire", Opt. Exp. 16, 17227 (2008).

M. Bayindir, F. Sorin, A. F. Abouraddy, J. Viens, S. D. Hart, J. D. Joannopoulos, Y. Fink, "Metal-Insulator-Semiconductor Optoelectronic Fibers", Nature 431, 826 (2004).

A. F. Abouraddy, M. Bayindir, G. Benoit, S. D. Hart, K. Kuriki, N. Orf, O. Shapira, F. Sorin, B. Temelkuran, Y. Fink, "Towards multimaterial multifunctional fibres that see, hear, sense and communicate" Nat. Mat. 6, 336 (2007).

M. Bayindir. A.F. Abouraddy, O. Shapira, J. Viens, D. Saygin-Hinczewski, F. Sorin, J. Arnold, J.D. Joannopoulos, Y. Fink, "Kilometer-long ordered nanophotonic devices by preform-to-fiber fabrication", IEEE J. Sel. Top. Quantum Electron., 12 (6): 1202-1213 (2006).

F. Sorin, A. F. Abouraddy, N. Orf, O. Shapira, J. Viens, J. Arnold, J. D. Joannopoulos, Y. Fink, Adv. Mater. 19, 3872-3877 (2007).

A. F. Abouraddy, O. Shapira, M. Bayindir, J. Arnold, F. Sorin, D. Saygin-Hinczewski, J. D. Joannopoulos, and Y. Fink, "Large-scale Optical-field measurements with geometric fiber constructs", Nat. Mat. 5 pp. 532-536 (2006).

F. Sorin, O. Shapira, Ayman F. Abouraddy, Matthew Spencer, Nicholas D. ORF1, John D. Joannopoulos and Yoel Fink "Exploiting the collective effects of optoelectronic devices integrated in a single fiber" NanoLetters , 9 (7), 2630-2635 (2009).

S. Egusa, Z. Wang, N. Chocat, Z.M. Ruff, A. M. Stolyarov, D. Shemuly, F. Sorin, P. T. Rakich, J. D. Joannopoulos and Y. Fink, "Muitimaterial piezoelectric fibers", Nat. Mat. 9. 643 (2010).

M. Bayindir, O. Shapira, D. Saygin-Hinczewski, J. Viens, A. F. Abouraddy, J. D. Joannopoulos, Y. Fink, "Integrated fibers for self-monitored optical transport", Nat. Mat. 4,820 (2005).

M. Bayindir, A. F. Abouraddy, J. Arnold, J. D. Joannopoulos, Y. Fink, "Thermal-sensing mesoscopic fiber devices by composite-material processing" Adv. Mater. 18, 845 (2006).

E. K. Sichel, J. I. Gittleman, P. Sheng, "Electrical properties of Carbon-polymer composite" J. of Elec. Mat, 11, 699 ( 1982).

N.D. Orf, O. Shapira, F. Sorin, S. Danto, M. A. Baldo, J. D. Joannopoulos, Y. Fink, "Fiber Draw Synthesis," Proc. of Nat. Ac. of Sc. 108 (2011) 4743.

S. Danto, F. Sorin, N.D. Orf, Z. Wang, S.A. Speakman, J. D. Joannopoulos and Y. Fink, "Fiber field-effect device via in-situ channel crystallization" Adv. Mat. 22 (2010) 4162.

D. S. Deng, N. D. Orf, A. F. Abouraddy, A. M. Stolyarov, J. D. Joannopoulos, H. A. Stone, and Y. Fink, "In-Fiber Semiconductor Filament Arrays", Nano Lett. 8, 4265 (2008).

\* cited by examiner

FIG. 1A-1
 Conducting Polymer
 Semiconductor
 Insulator
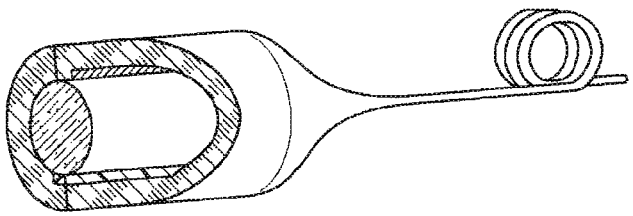
FIG. 1A-2
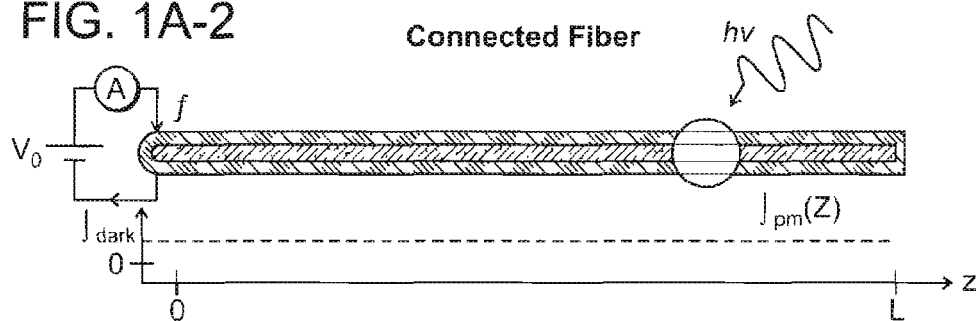
FIG. 1B
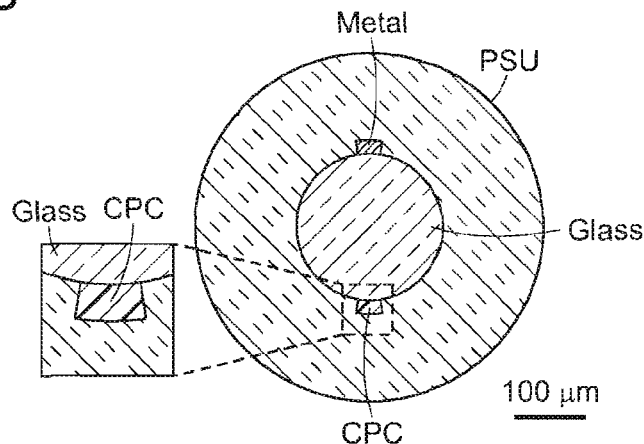
FIG. 1C
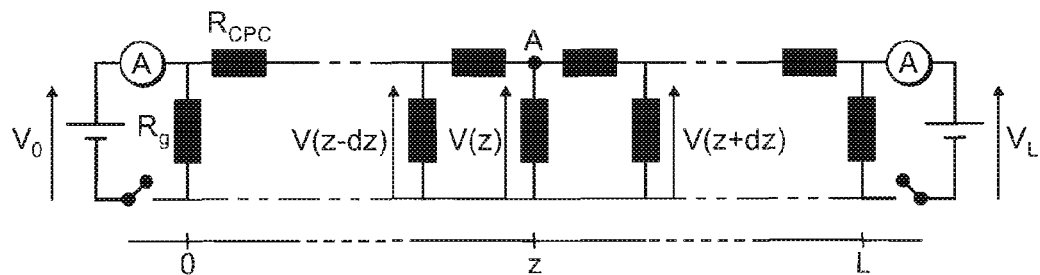

FIG. 5A   Two Incoming Beams
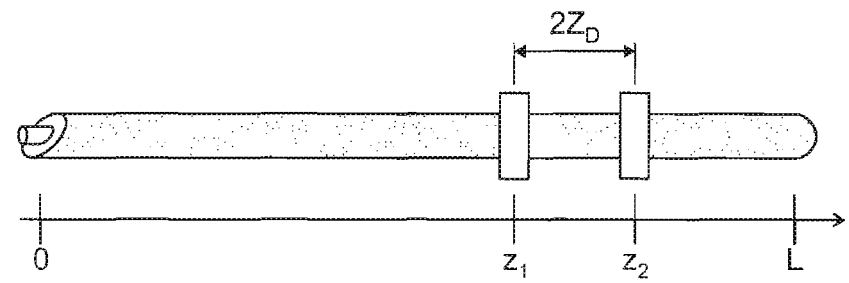
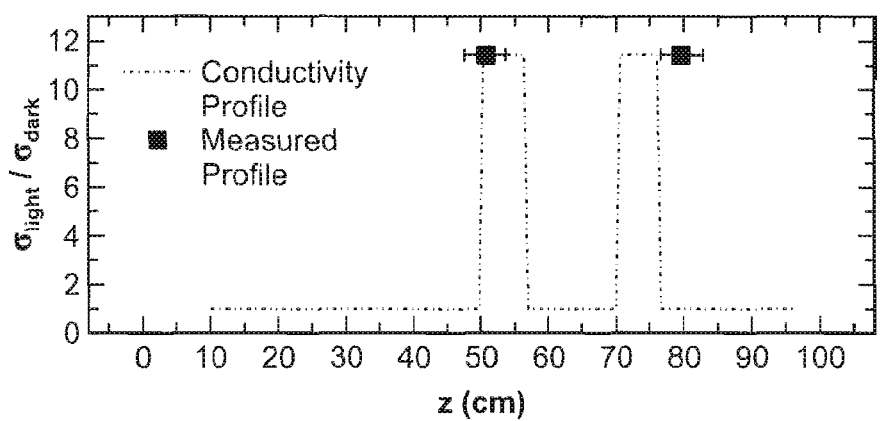
FIG. 5B   Three Incoming Beams
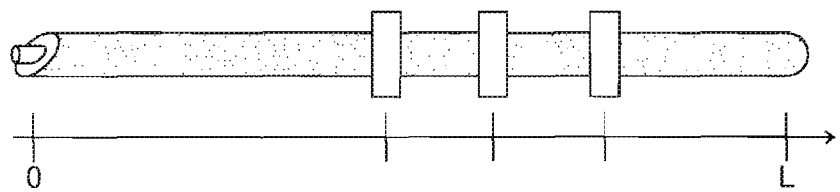
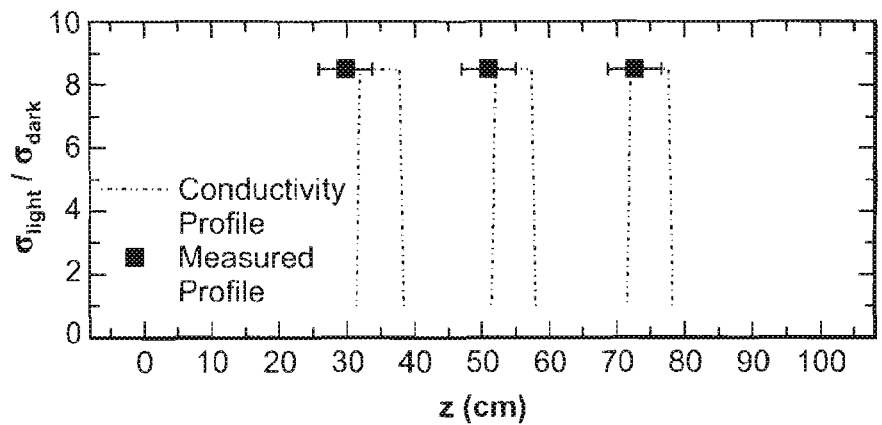

PHOTODETECTING FIBER

This application claims priority to U.S. provisional application Ser. No. 61/410,017 filed on Nov. 4, 2010, the contents of which are incorporated herein by reference in their entirety.

This invention was made with government support under Contract No. W911NF-07-D-0004 awarded by the Army Research Office and under Grant No. DMR0819762 awarded by the National Science Foundation. The government has certain rights in this invention.

BACKGROUND OF THE INVENTION

This invention relates to photodetecting fibers and more particularly to fibers including a resistive channel that breaks the fiber axial symmetry enabling the imposition of non-uniform, convex electric potential distributions along the fiber axis to detect and localize an incident optical beam.

Optical fibers rely on translational axial symmetry to enable long distance transmission. Their utility as a distributed sensing medium [1-3] relies on axial symmetry breaking either through the introduction of an a priori axial perturbation in the form of a bragg grating [4], or through the use of optical time (or frequency) domain reflectometry techniques [5,6] which measure scattering from an adhoc axial inhomogeneity induced by the incident excitation. These have enabled the identification and localization of small fluctuations of various stimuli such as temperature [7-9] and stress [10-11] along the fiber axis. Due to the inert properties of the silica material, most excitations that could be detected were the ones that led to structural changes, importantly excluding the detection of radiation at optical frequencies. Recently, a variety of approaches have been employed, aimed at incorporating a broader range of materials into fibers. [12-20]. In particular, multimaterial fibers with metallic and semiconductor domains have presented the possibility of increasing the number of detectable excitations to photons and phonons [19-25] over unprecedented length and surface area. Several applications have been proposed for these fiber devices in imaging [23,24], industrial monitoring [26,27], remote sensing and functional fabrics [20,21].

So far however, the challenges associated with resolving the intensity distribution of optical excitations along the fiber axis have not been addressed. Here we propose an approach that allows extraction of axially resolved information in a fiber that is uniform along its length without necessitating fast electronics or complex detection architectures.

SUMMARY OF THE INVENTION

The photodetecting fiber for detection and localization of an incident optical beam according to the invention includes a semiconducting core in intimate contact with a material forming a resistive channel that breaks axial symmetry. The resistive channel has a resistivity between that of metals and the semiconducting core that enables the imposition of non-uniform convex electric potential distributions along the fiber axis to allow photo-current measurements along the fiber. In a preferred embodiment of the invention, the resistive channel is a composite material such as polycarbonate with carbon black particles embedded therein. A suitable semiconducting core is made of a semiconducting chalcogenide glass. The semiconducting core may be solid or a hybrid thin film/solid core fiber structure.

According to the invention, an axial detection principle is established by fabricating the simplest geometry that supports a convex potential profile designed to break the fiber's axial symmetry. Then, an optimal structure that involves a hybrid solid-core/thin-film cross-sectional design is introduced that allows one to impose and vary convex electrical potential along a thin-film photodetecting fiber. The localization of a point of illumination along a one meter photodetecting fiber axis with a sub-centimeter resolution has been demonstrated. This disclosure also shows how the width of incoming radiation and the generated photoconductivity can be extracted. The present invention has been demonstrated using three simultaneously incident beams under given constraints.

BRIEF DESCRIPTION OF THE DRAWING

FIG. 1(A) (A1) is a perspective schematic illustration of the multi-material fiber drawing fabrication approach disclosed herein.

FIG. 1(A) (A2) is a schematic illustration of a connected photodetecting fiber with an illumination event. The graph represents the linear current density in the dark and under the represented illumination.

FIG. 1(B) is a scanning electron microscope micrograph of the fiber cross section.

FIG. 1(C) is an electrical schematic diagram of the fiber system's equivalent circuit.

FIG. 5(A) is a schematic illustration showing a photodetecting fiber illuminated by two similar optical beams along with a graph of position measurements of the two beams.

FIG. 5(B) is a schematic illustration of a photodetecting fiber illuminated by three similar optical beams along with a graph of position measurements of the three beams.

DESCRIPTION OF THE PREFERRED EMBODIMENT

Figure 2A:
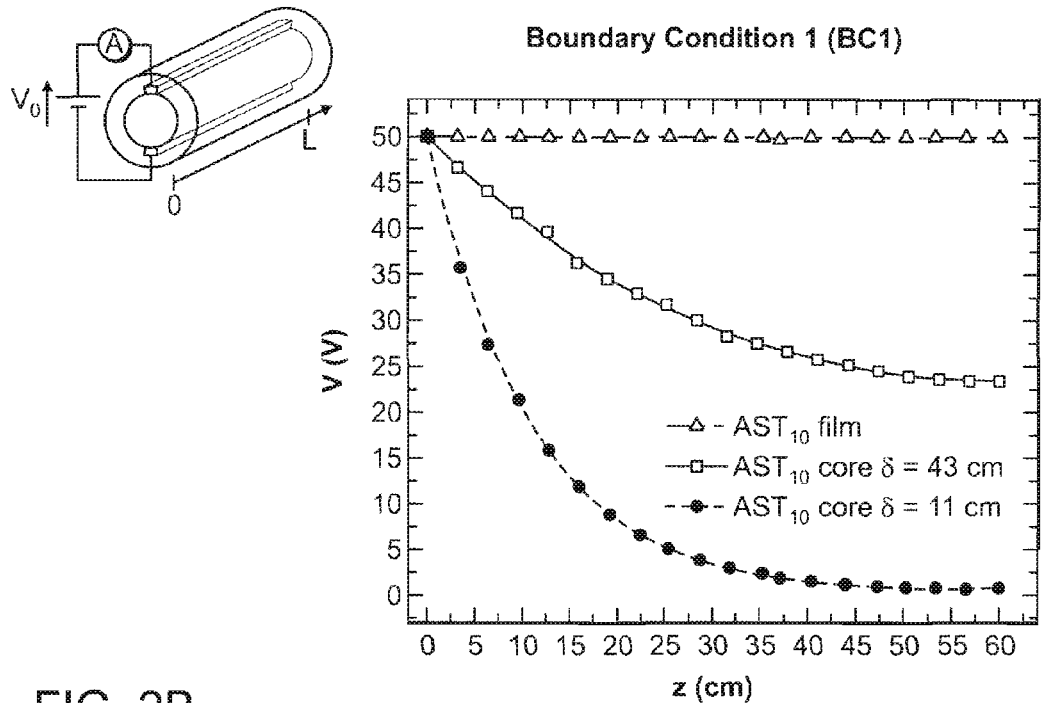
FIG. 2(A) is a schematic illustration of the fiber contact for boundary condition 1 along with a graph representing the experimental results and fitted with theoretical model lines of the voltage profile between the conducting polycarbonate electrode and the metallic conduct at different points along the fiber axis.

Photodetecting fibers typically comprise a semiconducting chalcogenide glass contacted by metallic electrodes and surrounded by a polymer matrix [19-21]. These materials are assembled at the preform level and subsequently thermally drawn into uniform functional fibers of potentially hundreds of meters in length, as illustrated in FIG. 1(A1). An electric potential V(z) across the semiconductor can he imposed along the fiber length by applying a potential drop $V_0$ at one end as depicted in FIG. 1(A2). As a result, a linear current density $j_{dark}$ is generated in the semiconductor in the dark, between the electrodes. When an incoming optical wave front with an arbitrary photon flux distribution $\Phi_0(z)$ is incident on a fiber of total length L, the conductivity is locally changed and a photo-current (total current measured minus the dark current) is generated due to the photoconducting effect in semiconductors, as illustrated in FIG. 1(A2). The measured photo-current in the external circuitry is the sum of the generated current density $j_{ph}(z)$ along the entire fiber length: $i_{ph} = C \int_0^L V(z) \sigma_{ph}(z) dz$, where C depends on the materials and geometry and is uniform along the fiber axis, and $\sigma_{ph}$ is the locally generated film photo-conductivity that depends linearly on $\Phi_0(z)$ in the linear regime considered [22-24,30-32]. Note that for simplicity the integrations on the other cylindrical coordinates r and θ are not represented. Also, we neglect the diffusion of generated free carriers along the fiber axis since it occurs over the order of a micrometer, several orders of magnitude lower than the expected resolution (millimeter range).

For the photodetecting fibers considered so far, the conductivity of the semiconductor in the dark and under illumination has been orders of magnitude lower than the one of the metallic electrodes. These electrodes could hence be considered equipotential, and $V(z) = V_0$ along the fiber axis over extend lengths. As a result, $j_{dark}$ is also uniform as depicted on the graph in FIG. 1(A2). Moreover, the photo-current measured in the external circuitry integrates the photo-conductivity distribution $\sigma_{ph}(z)$ along the fiber length. This single, global current measurement does not contain any local information about the incident optical intensity distribution along the fiber axis. In particular, even the axial position of a single incoming optical beam could not be reconstructed. To alleviate this limitation, we propose an approach that breaks the axial symmetry of this fiber system and enables to impose various non-uniform electric potential distributions along the fiber axis. By doing so, we can generate and measure several global photo-currents $i_{ph}$ where the fixed and unknown distribution $\sigma_{ph}(z)$ is modulated by different known voltage distributions $V(z)$. We will then be able to access several independent photo-current measurements from which information about the intensity distribution along the fiber axis will be extracted, as we will see.

To controllably impose a non-uniform electrical potential profile V(z), we propose to replace one (or both) metallic conducts by a composite material that has a higher electrical resistivity. This electrode, or resistive channel, can no longer be considered equipotential and the potential drop across the semiconductor will vary along the fiber axis. An ideal material for this resistive channel was found to be a composite polymer recently successfully drawn inside multimaterial fibers [27], that embeds Carbon black nanoparticles inside a Polycarbonate matrix (hereafter: conducting polycarbonate or CPC) [28]. The CPC resistivity, $\rho_{CPC}$ (1-10 Ω·m as measured post-drawing), lies in-between the low resistivity of metallic elements (typically $10^{-7}$ Ω·m) and the high resistivity of chalcogenide glasses (typically $10^6$-$10^{12}$ Ω·m) used in multimaterial fibers. It is very weakly dependant on the optical radiations considered so that it will not interfere with the detection process.

To validate this approach we first demonstrate the drawing compatibility of these materials. We fabricated a photodetecting fiber with a semiconducting chalcogenide glass core (of composition $As_{40}Se_{50}Te_{10}$) contacted by one metallic electrode ($Sn_{63}Pb_{37}$) and by another conduct made out of the proposed CPC composite. A Scanning Electron Microscope (SEM) micrograph of the resulting fiber cross-section is shown in FIG. 1B that demonstrate the excellent cross-sectional features obtained. To first theoretically analyze this new system, we depict its equivalent circuit in FIG. 1C. The semiconducting core can be modeled as multiple resistors in parallel, while the CPC channel is comprised of resistors in series. To find the voltage distribution V(z) in this circuit, we can apply Kirchoff's laws at point A:

$$\frac{V(z) - V(z - dz)}{R_{CPC}} = \frac{V(z + dz) - V(z)}{R_{CPC}} - \frac{V(z)}{R_g}, \text{ or } \frac{\partial^2 V}{\partial z^2} = \frac{R_{CPC}}{R_g dz^2} V(z) \quad (1)$$

or simple $$\frac{\partial^2 V}{\partial z^2} = \frac{V(z)}{\delta(z)^2} \quad (2)$$

with $$\delta(z) = \sqrt{\frac{\rho_g(z)}{\rho_{cpc}} \frac{\pi}{2} S_{cpc}} \quad (3)$$

where $R_{CPC}$ is the resistance of the CPC channel over an infinitesimal distance $dz (R_{CPC} = \rho_{CPC} dz/S_{CPC})$, $S_{CPC}$ being the surface area of the CPC electrode in the fiber cross-section. Similarly, $R_g$ is the resistance of a slab of cylindrical semiconducting core of length dz that can be derived by considering a point contact between the electrodes and the solid-core, $(R_g(z) = \pi \rho_g(z)/(2dz)$, with $\rho_g$ the glass resistivity). The new parameter δ has the dimensionality of a length and is referred to as the characteristic length of the fiber system. It can be tuned by engineering the glass composition (hence changing $\rho_g$), as well as the structure and geometry of the fiber.

Figure 2B:
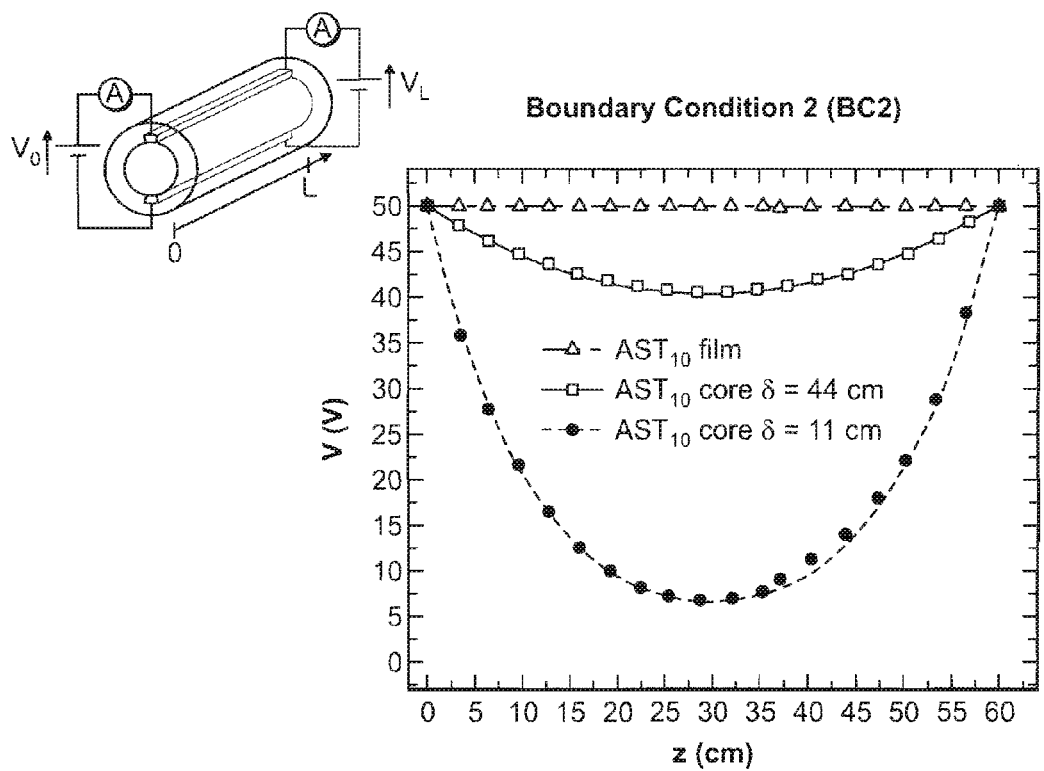
FIG. 2(B) is a schematic of the fiber contact for boundary condition 2 and graph representing the experimental results.

Two sets of boundary conditions depicted in FIG. 2 can be defined for this system: BC(1) where one fiber end (z=0 or L) is brought to a potential $V^{BC(1)}(0) = V_0$ while the other (z=L or 0) is left floating, resulting in $\partial V^{BC(1)}(L)/\partial z = 0$ since no accumulation of charges is expected; and BC(2) where we apply a voltage at both fiber ends, $V^{BC(2)}(0) = V_0$ and $V^{BC(2)}(L) = V_L$. The two potential profiles can then be derived when δ is independent of z, and are given by two convex functions:

$$V^{BC1}(z) = \frac{V_0 \cosh\left(\frac{L-z}{\delta}\right)}{\cosh\left(\frac{L}{\delta}\right)} \quad (4)$$

$$V^{BC2}(z) = \frac{V_0 \sinh\left(\frac{L-z}{\delta}\right) + V_L \sinh\left(\frac{z}{\delta}\right)}{\sinh\left(\frac{L}{\delta}\right)} \quad (5)$$

To assess our model, we fabricated three fibers with different materials and structures. All fibers have one metallic electrode ($Sn_{63}Pb_{37}$ alloy) and one CPC electrode of same size. Two fibers have a solid-core structure like the one shown in FIG. 1B, with two different glass compositions from the chalcogenide system As—Se—Te, $As_{40}Se_{50}Te_{10}$ ($AST_{10}$) and $As_{40}Se_{42}Te_{18}$ ($AST_{18}$). The third fiber has a thin-film structure with a 500 nm layer of $As_{40}Se_{50}Te_{10}$ [22,24]. This thin film structure is expected to have a very large characteristic length since its conductance is many orders-of-magnitude lower than the one of both metallic and CPC electrodes. In solid-core fibers however, δ should be of the order of the fiber length, inducing a significant variation in the potential profile. Separate measurement of the CPC electrode resistivity ($\rho_{CPC}$=1.4 Ω·m and $\rho_{CPC}$=1.2 Ω·m in pieces from the $AST_{10}$ and $AST_{18}$ fibers respectively) and the glass conductivities lead to expected δ values of 40 cm and 9 cm in the $AST_{10}$ and $AST_{18}$ fibers respectively, the higher conductivity of $AST_{18}$ being responsible for the lower δ parameter [33].

We then cut a 60-cm-long piece from each fiber and made several points of contact on the CPC electrodes while contacting the metallic conduct at a single location. We applied a 50 V potential difference for both BC(1) and BC(2), and measured the potential drop between the contact points along the CPC channel and the equipotential metallic conduct, using a Keithley 6517A multimeter. The experiment was performed in the dark to ensure the uniformity of δ. The results are presented in FIG. 2 where the data points are the experimental measurements while the curves represent the theoretical model derived above, fitted over δ. As we expected, the thin-film fiber maintains a uniform potential along its axis. For solid-core fibers, the fitting values (43 cm and 11 cm for BC(1), and 44 cm and 11 cm for BC(2) for $AST_{10}$ and $AST_{18}$ fibers respectively) match very well with the expected δ parameters given above. The discrepancy is due to errors in measuring the different dimensions in the fiber, and potential slight non-uniformity of the glass conductivity due to local parasitic crystallization during the fabrication process [34]. Noticeably, the δ values obtained for both boundary conditions are in excellent agreement, which strongly validates our model.

Figure 3A:
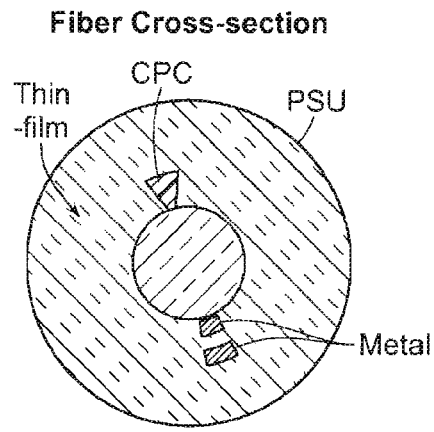
FIG. 3(A) is a scanning electron microscope micrograph of a fiber with the thin-film/solid-core structure disclosed herein.
Figure 3B:
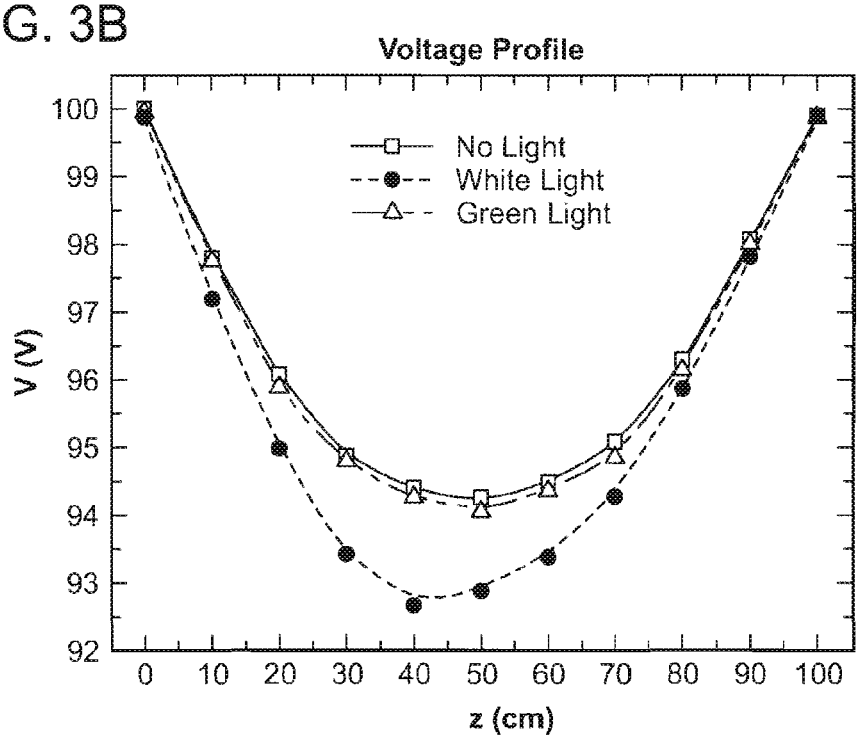
FIG. 3(B) is a graph of experimental results of the voltage profile of a one-meter long fiber piece in the dark and under a spot of white light and green light at the same location, same width and of similar intensity.
Figure 3C:
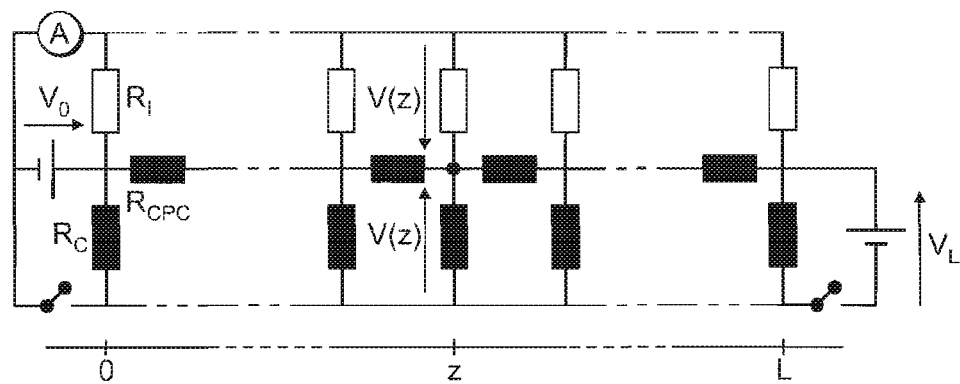
FIG. 3(C) is an electrical schematic of the electrical connection to one fiber end.

Solid core fibers can hence support convex potential profiles that can be tuned using different glass compositions or fiber structure. When an optical signal is impingement on the fiber however, δ is no longer uniform as we considered earlier, since the glass resistivity is locally changed. This will in turn affect V(z) that becomes an unknown function of the intensity distribution of the optical wave front. Moreover, thin-film structures are a more attracting system to work with in light of their better sensitivity and other advantages described in ref. [22]. To address these observations we propose an hybrid structure that enables to impose convex potential distributions that remain unchanged under illumination, across a semiconducting thin-film that is used as the higher sensitivity detector. The fiber cross-section is shown in FIG. 3A, where a CPC electrode contacts both a solid-core and a thin-film structure. The equivalent circuit is represented in FIG. 3C, where one can see that the two systems are in parallel. The drop of potential between the CPC channel and the metallic electrodes (both at the same potential) expressed in Eq. 1 now becomes: $V(1/R_c+1/R_f)$ where $R_c$ and $R_f$ are the resistance of a slab of cylindrical semiconducting solid-core and thin-film respectively, of length dz. This leads to a new differential equation:

$$\frac{\partial^2 V}{\partial z^2} = V\left(\frac{1}{\delta_c^2} + \frac{1}{\delta_f^2}\right) \approx \frac{V}{\delta_c^2} \quad (6)$$

since $\delta_c$ and $\delta_f$, the characteristic parameters for the solid-core and the thin-film respectively, verify $\delta_c \ll \delta_f$ as can be anticipated from earlier results. The potential distribution is hence imposed by the solid-core system, while the current flowing through the photoconducting film can be measured independently, thanks to the different metallic electrodes contacting the solid-core and the thin-film structures. Similar boundary conditions can be imposed to the solid-core sub-system as before.

To verify our approach we fabricated a fiber integrating a structure with a CPC electrode in contact with both a solid-core of $AST_{10}$ and a thin layer of the $As_{40}Se_{52}Te_8$ glass. This glass composition was chosen for its better thermal drawing compatibility with the polysulfone (PSU) cladding used here, which results in a better layer uniformity. Note that in this fiber, the metallic electrodes were embedded inside a CPC electrode. The conductivity of this assembly is still dominated by the high conductivity of the metal. The high viscosity of CPC in contact with the thin-film is however beneficial to maintain a layer of uniform thickness [35]. The contacts between the CPC electrodes and the glasses were found to be ohmic.

We reproduced the experiment described above to measure the potential drop between the CPC and the metallic electrodes along a one-meter long fiber piece. This time however, the experiment was done under three conditions: first in the dark, then when the fiber was illuminated, at the same location, by a white light source and then by a green (532 nm) LED, with intensity so that the generated photo-current in the thin-film by both illumination was almost the same. The results are shown in FIG. 3B and illustrate the proposed concept very well. Indeed, Since the green light is almost fully absorbed in the semiconducting layer [24], a significant change of thin-film resistivity (and hence a high photo-current) can be obtained while leaving $\delta_c$, and thus the potential distribution across the layer, unchanged. White light on the other hand penetrates much deeper in the material and will change the conductivity of both the thin-film and the fiber core, changing $\delta_c$ and the voltage distribution. From these experiments we could extract the value $\delta_c$=143 cm for this fiber system. This value is much larger than measured before due to the increase of $S_{CPC}$ imposed by the new structure design. Note that we used green versus white light for this proof of concept, but many fiber parameters such as the glass composition or fiber geometry can be tuned to apply this approach to a wide range of radiation frequencies.

Our new fiber system can now support a fixed potential profile V(z) that can be varied by changing the applied boundary conditions. Given the linear relation of hyperbolic functions that appear in the convex potential profiles derived in Eq. (3), one realizes that all possible profiles are a linear combination of the two functions:

$$V^I(z) = \frac{V}{\sinh(L/\delta_c)} \sinh\left(\frac{L-z}{\delta}\right) \quad (7)$$

and $$V^{II}(z) = \frac{V}{\sinh(L/\delta_c)} \sinh\left(\frac{z}{\delta}\right) \quad (8)$$

obtained for the boundary conditions $V_0$=V and $V_L$=0, and vice versa. A third independent voltage profile can also be imposed by applying a voltage between the CPC electrode and the electrode contacting the thin-film only, resulting in a nearly uniform potential $v^{III}(z)$=V, since $\delta_f$ is much larger than the fiber lengths considered. Hence, we can measure three independent photo-currents that result from the integration of the stimuli intensity profile modulated by these different voltage distributions, from which some axial information about $\sigma_{ph}$ and hence $\Phi_0$ can be extracted as we show below.

Let us consider the case of an incident uniform light beam, with a rectangular optical wave front, at a position $z_0$ along the fiber axis, and with a width $2\Delta z$. It generates a photo-conductivity profile $\sigma_{ph}(z)=\sigma_{ph}$ if $z \in [z_0-\Delta z_0+\Delta z]$, and 0 otherwise. The generated current for each configuration can be derived, integrating over the illumination width and re-arranging the hyperbolic terms:

$$i_{ph}^{I} = \frac{2CV\sigma_{ph}}{\sinh(L/\delta_c)} \sinh\left(\frac{L-z_0}{\delta_c}\right) \sinh\left(\frac{\Delta z}{\delta_c}\right) \quad (9)$$

$$i_{ph}^{II} = \frac{2CV\sigma_{ph}}{\sinh(L/\delta_c)} \sinh\left(\frac{z_0}{\delta_c}\right) \sinh\left(\frac{\Delta z}{\delta_c}\right) \quad (10)$$

$$i_{ph}^{III} = 2CV\sigma_{ph}\Delta z \quad (11)$$

Remarkably, the first two currents are a function of the beam position which can be simply extracted by taking the ratio $r=i_{ph}^{I}/i_{ph}^{II}$ leviating the dependence on the beam intensity and width. We can extract $z_0$ from the measurement of r through the relation:

$$z_0 = \frac{\delta_c}{2} \ln\left[\frac{e^{L/\delta_c}+r}{e^{-L/\delta_c}+r}\right] \quad (12)$$

Figure 4A:
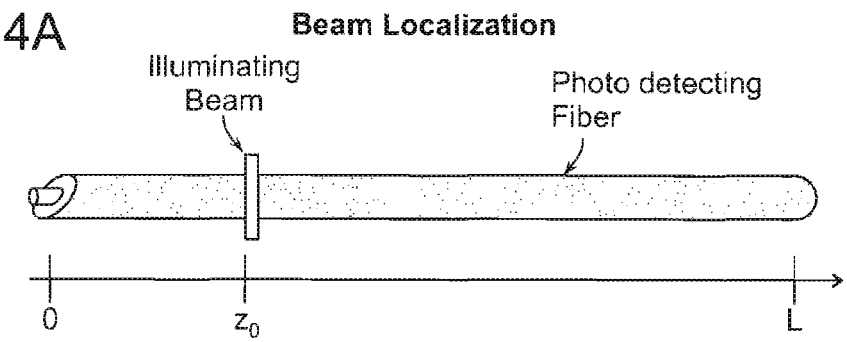
FIG. 4(A) is a schematic illustration of fiber illuminated by a single optical beam and a graph of the real position and reconstructed position with error bars of an optical beam incident on a one-meter long fiber at different positions.
Figure 4A:
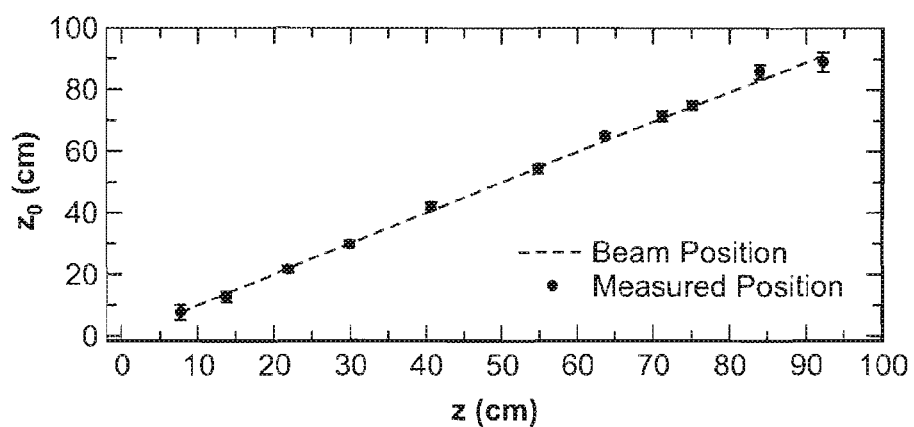
Figure 4B:
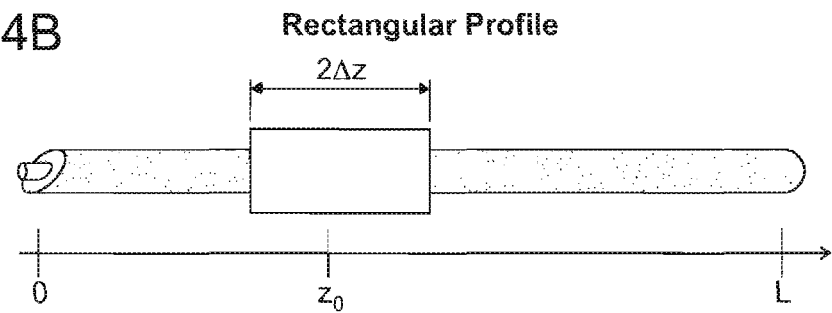
FIG. 4(B) is a schematic illustration of fiber illuminated by a rectangular optical wave front along with a graph of the real profile and reconstructed profile of a rectangular wave front incident on the same fiber.
Figure 4B:
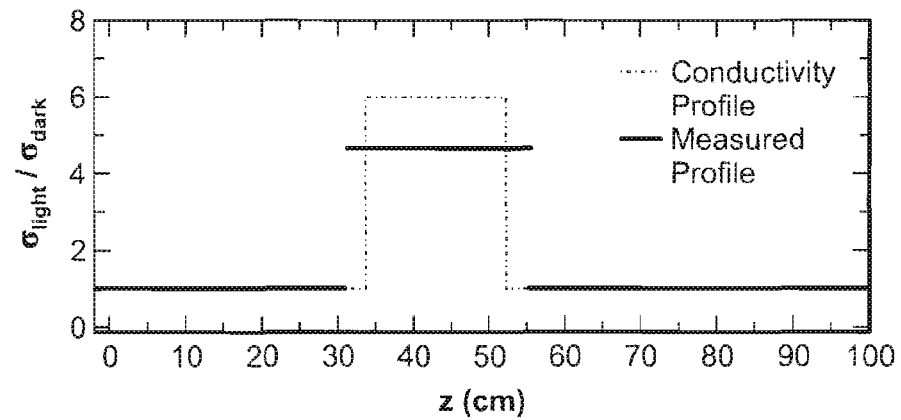

This was experimentally verified by illuminating a one-meter long piece of the fiber shown in FIG. 3, with a 1 cm width beam from a green LED, at different locations along the fiber length. The results are shown in FIG. 4A where the straight line represents the experimental points of illumination of the fiber while the dots are the reconstructed positions from measuring the ratio of photo-currents r. The agreement between the experimental and measured positions is excellent, with errors made on the position smaller than ±0.4 cm in the middle of the fiber.

Error over the beam position depends on a large number of parameters (Fiber length, $\delta_c$, beam position and intensity, geometry etc . . . ). Indeed, fluctuations of the photo-currents, that come from various sources [30-32], lead to variations on the ratio r, resulting in errors in the measured beam's position. To assess the resolution of our system, we first measured the dark current noise $i_N$, considered in good approximation to be the only source of noise here. We found it to be around 10 pA in our experimental conditions, using similar techniques as those explained in ref. [22]. This noise current is the same for configurations I and II given the symmetry of the system. Intuitively, when one measures a photo-current $i_{ph}^{I, II}$, its mean value lies within the segment defined by $i_{ph}^{I,II}\pm i_N$. In a simple and conservative approach, we define the resolution of our system as the difference $z_{0+}-z_{0-}$ of the two obtained positions $z_{0+}$ and $z_{0-}$ when the maximum error on the currents are made, i.e when r is given by $r_+=(i_{ph}^{I}+i_N)/(i_{ph}^{II}-i_N)$ and $r_-=(i_{ph}^{I}-i_N)/(i_{ph}^{II}+i_N)$ respectively. These error bars are represented in the graph of FIG. 4A. The resolution found is sub-centimeter, corresponding to two orders of magnitude smaller than the fiber length. This is to the best of our knowledge the first time that a beam of light can be localized over such an extended length and with such a resolution, using a single one dimensional distributed photodetecting device requiring only four points of electrical contact.

The beam position is not the only spatial information we can reconstruct with this system. Indeed, the ratio of and $i_{ph}^{II}$ and $i_{ph}^{III}$ allows us to reconstruct $\Delta z$ as $z_0$ is known, by measuring the ratio $\sinh(\Delta z/\delta_c)/(\Delta z/\delta_c)$. This also enables to evaluate $\sigma_{ph}$, using $i_{ph}^{III}$, and hence reconstruct the associated beam intensity. In FIG. 3B we show the experimental illumination profile of a green LED light (black dashed line, centered at 43 cm, width 18 cm, with a conductivity $\sigma_{ph}=6\,\sigma_{dark}$) and the reconstructed profile from current measurements (blue data points, centered at 43.5 cm, width 24 cm and $\sigma_{ph}=4.7\,\sigma_{dark}$). The positioning is very accurate as expected from the results above, while a slightly larger width is measured. This error is due to the large value of $\delta_c$ compared to $\Delta z$, which results in a ratio of $i_{ph}^{II}$ to $i_{ph}^{III}$ more sensitive to noise than the ratio of $i_{ph}^{I}$ over $i_{ph}^{II}$. It is however clear from discussions above that the fiber system can be designed to have a much better resolution for different beam width ranges, by tuning $\delta_c$ to smaller values.

Also under study is the integration time required for this system. The speed at which we can vary the potentials depends on the bandwidth associated with the equivalent circuit, taking into account transient current effects in amorphous semiconductors. In this proof-of-concept, measurements were taken under DC voltages applied, varying the boundary conditions after transient currents are stabilized (typically after a few seconds). Novel designs, especially fibers where the semiconducting material has been crystallized through a post-drawing crystallization process [14], and integrating rectifying junctions that have proven to have several kHz of bandwidth [15], could result in significant improvement in device performance and speed.

When more than one beam is incident on the fiber, each one brings a set of three unknown parameters to he resolved (its axial position, width and power). Since our detection scheme provides three independent photo-currents, some prior knowledge on the stimuli is then required to localize each beam along the fiber axis. For example, we can localize two similar illumination events (with approximately same width and power), that are incident at different axial positions. Let us consider the simpler case where two such beams impinging the fiber have a width $2\Delta z$ much smaller than the solid-core characteristic length $\delta_c$ (so that $\sinh(\Delta z/\delta_c)/(\Delta z/\delta_c)\approx 1$). They each generate a photo-conductivity $\sigma_{ph}$ at their positions $z_1$ and $z_2$ (with $z_1<z_2$). The photo-currents measured are the sum of the measured currents with individual beams. Defining $$Z_m = \frac{z_1+z_2}{2} \text{ and } Z_D = \frac{z_2-z_1}{2},$$

we can derive:

$$i_{ph}^{I} = \frac{4CV\sigma_{ph}}{\sinh(L/\delta_c)} \sinh\left(\frac{\Delta z}{\delta_c}\right) \sinh\left(\frac{L-Z_m}{\delta_c}\right) \sinh\left(\frac{Z_D}{\delta_c}\right) \quad (13)$$

$$i_{ph}^{II} = \frac{4CV\sigma_{ph}}{\sinh(L/\delta_c)} \sinh\left(\frac{\Delta z}{\delta_c}\right) \sinh\left(\frac{Z_m}{\delta_c}\right) \sinh\left(\frac{Z_D}{\delta_c}\right) \quad (14)$$

$$i_{ph}^{III} = 4CV\sigma_{ph}\Delta z \quad (15)$$

Following the same approach as in the single beam case, we can reconstruct $Z_m$ and $Z_D$, and hence $z_1$ and $z_2$. On FIG. 5A, we show the experimental illumination of a fiber with two identical beams of width 6 cm from the same green LED (dashed black curve) at positions 54 cm and 75 cm. The blue dots represent the reconstructed beam position, with measured position 51±3 cm and 78±3 cm for the two beams. The error on the positions were computed in a similar fashion as before.

An optical signal made out of three beams requires even more additional constraints to be resolved. For example, three similar beams equidistant from one to the next can be detected and localized with our system. Indeed, here again only two unknowns have to be found: the central beam position and the distance between two adjacent beams. The derivation of the algorithm to extract these positions from the different current measurements is very similar to what has been derived above. In FIG. 5B we show experimental results of the localization of three incoming beams of same width ($\Delta z=6$ cm) and intensity (generating a photo-conductivity $\sigma_{ph}=8.5\ \sigma_{dark}$) at positions $z_1=35.5$ cm, $z_2=55.5$ cm, and $z_3=75.5$ cm. The generated conductivity pattern is represented by a black doted line on the graph. The reconstructed positions from photo-current measurements were 30±4 cm, 51.5±4 cm and 73±4 cm, in very good agreement with the real beams locations. Note that in these two multiple beams cases we do not need to know the power of the beams as long as we assume that it is the same for each one. We cannot reconstruct it wither as we did above, as it would require additional information on the stimuli such as knowing their width.

In conclusion, a novel multimaterial fiber that integrates insulating and semiconducting domains in intimate contact with conducting metallic and polymeric materials was demonstrated. The breaking of the axial uniformity of the voltage distribution was achieved, and convex potential profiles along the fiber axis that can be varied by changing the boundary conditions were successfully generated. As a result, the position, width and the generated photoconductivity of an arbitrary incoming rectangular optical wavefront could be reconstructed. Under given constraints, two and three simultaneously incident beams could also be spatially resolved.

The ability to localize various stimuli along extended fiber length using simple electronic 375 measurement schemes and with limited electrical connections, significantly impacts multimaterial fiber sensor performance. Among many examples, defects in self-monitored optical fibers could not only he detected but also localized [25]. Fiber-based lenseless imaging grids and fabrics [23,24] would require simpler or no back projection algorithm procedure to extract a 2D intensity pattern, significantly improving their practicality.

Finally, the concepts introduced here address in an original way the fundamental challenge of "pixellizing" a distributed sensor. The results presented on localizing optical intensity variations over long distances reassemble the pioneering work reported on distributed temperature sensing using optical fibers in ref. [7-9], that led to the important developments of today's fiber optic sensing technology. New ways to address the fiber and measure more independent photo-currents are under study to enable the reconstruction of increasingly complex optical wave fronts, paving the way towards distributed light sensing.

Numbers in brackets refer to the references listed herein. The contents of all of these references are incorporated herein by reference.

It is recognized that modifications and variations of the invention will be apparent to those of ordinary skill in the art and it is intended that all such modifications and variations be included within the scope of the appended claims.

REFERENCES

1. F. Yu, S. Yin, Fiber Optic Sensors, Marcel-Dekker, (2008).
2. K. T. V. Grattan and B. T. Meggitt, Editors, Optical Fiber Sensor Technology, Fundamentals, Kluwer Academic Publishers, Boston (2000).
3. A. Rogers, "Distributed optical-fiber sensing", Meas. Sci. Technol. 10, R75 (1999).
4. A. Othonos and K. Kalli. Fiber Bragg Gratings—Fundamentals and Applications in Telecommunications and Sensing, Artech House, Boston (1999).
5. M. K. Barnoski and S. M. Jensen, "Fiber waveguides: a novel technique for investigating attenuation characteristics", Applied Optics 15, 2112 (1976).
6. A. J. Rogers, "Polarization optical time domain reflectometry: a technique for the measurement of field distributions", Applied Optics, 20 1060 (1981).
7. A. H. Hartog, "A distributed temperature sensor based on liquid-core optical fibers", IEEE J. Light. Tech., 1(3), 498 (1983).
8. J. P. Dakin, D. J. Pratt, G. W. Bibby, J. N. Ross, "Distributed optical fiber raman temperature sensor using a semiconductor light source and detector", Elec. Lett., 21, 569 (1985)
9. T. Kurashima, T. Horiguchi, and M. Tateda, "Distributed-temperature sensing using stimulated Brillouin scattering in optical silica fibers" Opt. Lett. , 15, 1038 (1990).
10. C. I. Merzbachery, A. D. Kersey and E. J. Friebele, "Fiber optic sensors in concrete structures: a review", Smart Mater. Struct. 5, 196 (1996).
11. X. Bao, D. J. Webb, D. A. Jackson, "Combined distributed temperature and strain sensor based on Brillouin loss in an optical fiber", Opt. Lett. 16, 141 (1994).
12. P. J. A. Sazio, A. Amezcua-Correa, C. E. Finlayson, J. R. Hayes, T. J. Scheidemantel, N. F. Baril, B. R. Jackson, D. J. Won, F. Zhang, E. R. Margine, V. Gopalan, V . H. Crespi, J. V. Badding, "Microstructured Optical Fibers as High-Pressure Microfluidic Reactors", Science 311, 1583 (2006).
13. T. T. Larsen, A. Bjarklev, D. S. Hermann, and J. Broeng, "Optical devices based on liquid crystal photonic bandgap fibres," Opt. Exp. 11, 2589 (2003).
14. B. O'Connor, K. H. An, Y. Zhao, K. P. Pipe, M. Shtein, "Fiber Shaped Organic Light Emitting Device", Adv. Mat. 19, 3897 (2007).
15. B. O'Connor, K. P. Pipe, M. Shtein, "Fiber based organic photovoltaic devices", Appl. Phys. Lett. 92, 193306 (2008).
16. M. Fokine, L. E. Nilsson, A. Claesson, D. Berlemont, L. Kjellberg. L, Krummenacher, and W. Margulis, "Integrated fiber Mach-Zehnder interferometer for electro-optic switching" Opt. Lett. 27, 1643 (2002).
17. M. A. Schmidt, L. N. Prill Sempere, H. K. Tyagi, C. G. Poulton, and P. St. J. Russell, "Waveguiding and plasmon resonances in two-dimensional photonic lattices of gold and silver nanowires" Phys. Rev. B, 77, 033417 (2008)
18. H. K. Tyagi, M. A. Schmidt, L. Prill Sempere and P. St. J. Russell, "Optical properties of photonic crystal fiber with integral micron-sized Ge wire", Opt. Exp. 16, 17227 (2008).
19. M. Bayindir, F. Sorin, A. F. Abouraddy, J. Viens, S. D. Hart, J. D. Joannopoulos, Y. Fink, "Metal-Insulator-Semiconductor Optoelectronic Fibers", Nature 431, 826 (2004).
20. A. F. Abouraddy, M. Bayindir, G. Benoit, S. D. Hart, K. Kuriki, N. Orf, O. Shapira, F. Sorin, B. Temelkuran, Y. Fink, "Towards multimaterial multifunctional fibres that see, hear, sense and communicate" Nat. Mat, 6, 336 (2007).
21. M. Bayindir, A. F. Abouraddy, O. Shapira, J. Viens, D. Saygin-Hinczewski, F. Sorin, J. Arnold, J. D. Joannopoulos, Y. Fink, "Kilometer-long ordered nanophotonic devices by preform-to-fiber fabrication", IEEE J. Sel. Top. Quantum Electron., 12 (6): 1202-1213 (2006)

22. F. Sorin, A. F. Abouraddy, N. Orf, O. Shapira, J. Viens, J. Arnold, J. D. Joannopoulos, Y. Fink, Adv. Mater. 19, 3872-3877 (2007).
23. A. F. Abouraddy, O. Shapira, M. Bayindir, J. Arnold, F. Sorin, D. Saygin-Hinczewski, J. D. Joannopoulos, and Y. Fink, "Large-scale Optical-field measurements with geometric fiber constructs", Nat. Mat. 5 pp. 532-536 (2006),
24. F. Sorin, O. Shapira, Ayman F. Abouraddy, Matthew Spencer, Nicholas D. Orfl, John D. Joannopoulos and Yoel Fink "Exploiting the collective effects of optoelectronic devices integrated in a single fiber" NanoLetters, 9 (7), 2630-2635 (2009).
25. S. Egusa, Z. Wang, N. Chocat, Z. M. Ruff, A. M. Stolyarov, D. Shemuly, F. Sorin, P. T. Rakich, J. D. Joannopoulos and Y. Fink, "Multimaterial piezoelectric fibers", Nat. Mat. 9, 643 (2010).
26. M. Bayindir, O. Shapira, D. Saygin-Hinczewski, J. Viens, A. F. Abouraddy, J. D. Joannopoulos, Y. Fink, "Integrated fibers for self-monitored optical transport", Nat. Mat. 4, 820 (2005).
27. M. Bayindir, A. F. Abouraddy, J. Arnold, J. D. Joannopoulos, Y. Fink, "Thermal-sensing mesoscopic fiber devices by composite-material processing" Adv. Mater. 18, 845 (2006).
28. E. K. Sichel, J. I. Gittleman, P. Sheng, "Electrical properties of Carbon-polymer composite" J. of Elec. Mat, 11, 699 (1982).
29. N. D. Orf, O. Shapira, F. Sorin, S. Danto, M. A. Baldo, J. D. Joannopoulos, Y. Fink, "Composite Diode Fibres fabricated via in-situ Compound Synthesis," Proc. of Nat. Ac. of Sc. 108 (2011) 4743.
30. E. Rosencher, B. Vinter, Optoelectronics, Cambridge University Press, New York (2002). 31. Sze, S. M. Semiconductor Devices: Physics and Technology 2nd edn (John Wiley, New York, (2001).
32. R. H. Kingston, Detection of Optical and Infrared Radiation, Springer-Verlag, Berlin, N.Y. (1978).
33. Z. U. Borisova, Glassy Semiconductors, Plenum Press, New York,(1981).
34. S. Danto, F. Sorin, N. D. Orf, Z. Wang, S. A. Speakman, J. D. Joannopoulos and Y. Fink, "Fiber field-effect device via in-situ channel crystallization" Adv. Mat. 22 (2010) 4162.
35. D. S. Deng, N. D. Orf, A. F. Abouraddy, A. M. Stolyarov, J. D. Joannopoulos, H. A. Stone, and Y. Fink, "In-Fiber Semiconductor Filament Arrays", Nano Lett. 8, 4265 (2008).

What is claimed is:

1. Photodetecting fiber for detection and localization of an incident optical beam comprising:
   a semiconducting core in intimate contact with a material forming a resistive channel that breaks axial symmetry, the resistive channel having a resistivity between that of metals and the semiconducting core enabling the imposition of non-uniform, convex electric potential distributions along the fiber axis allowing photo-current measurements along the fiber,
   wherein the resistive channel is a composite material of polycarbonate with carbon black nanoparticles embedded therein.
2. The photodetecting fiber of claim 1, wherein the core is a semiconducting chalcogenide glass.
3. The photodetecting fiber of claim 1, wherein the core is a hybrid thin-film/solid-core fiber structure.

\* \* \* \* \*